(12) United States Patent
Noh

(10) Patent No.: US 8,766,282 B2
(45) Date of Patent: Jul. 1, 2014

(54) ORGANIC LIGHT EMITTING DISPLAY WITH LUMINESCENT LAYERS HAVING VARYING THICKNESSES TO IMPROVE COLOR REPRODUCIBILITY

(71) Applicant: Samsung Display Co., Ltd., Yongin (KR)

(72) Inventor: Seung Uk Noh, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/746,224

(22) Filed: Jan. 21, 2013

(65) Prior Publication Data

US 2014/0110701 A1 Apr. 24, 2014

(30) Foreign Application Priority Data

Oct. 22, 2012 (KR) .......................... 10-2012-0117358

(51) Int. Cl.
*H01L 27/15* (2006.01)
*H01L 29/18* (2006.01)

(52) U.S. Cl.
USPC .. 257/79; 257/88; 257/E51.005; 257/E51.022

(58) Field of Classification Search
None
See application file for complete search history.

(56) References Cited

U.S. PATENT DOCUMENTS

| 2005/0140277 | A1* | 6/2005 | Suzuki et al. | 313/504 |
| 2010/0052524 | A1* | 3/2010 | Kinoshita | 313/504 |
| 2011/0127500 | A1* | 6/2011 | Ko et al. | 257/40 |
| 2011/0165714 | A1 | 7/2011 | Oh | |
| 2011/0168986 | A1* | 7/2011 | Lee et al. | 257/40 |
| 2011/0241000 | A1* | 10/2011 | Choi et al. | 257/59 |
| 2012/0229014 | A1* | 9/2012 | Shiratori | 313/498 |

FOREIGN PATENT DOCUMENTS

| KR | 10-2005-0110793 A | 11/2005 |
| KR | 10-0685804 B1 | 2/2007 |
| KR | 10-2008-0061673 A | 7/2008 |
| KR | 10-2011-0077838 A | 7/2011 |

* cited by examiner

*Primary Examiner* — Julio J Maldonado
*Assistant Examiner* — Harpreet Singh
(74) *Attorney, Agent, or Firm* — Knobbe, Martens Olson & Bear, LLP

(57) ABSTRACT

An organic light emitting display is disclosed. In one aspect, the display includes a substrate, thin film transistors disposed on the substrate, first, second, and third pixel definition layers disposed on the thin film transistors, respectively having openings, and respectively having first, second, and third heights different from each other, and first, second, and third organic light emitting devices disposed in the openings of the first, second, and third pixel definition layers and connected to the thin film transistors, respectively. The first, second, and third pixel definition layers are spaced apart from each other, the first, second, and third organic light emitting devices have different thicknesses from each other, and the first, second, and third organic light emitting devices have thicknesses respectively corresponding to the first, second, and third heights of the first, second, and third pixel definition layers.

7 Claims, 7 Drawing Sheets

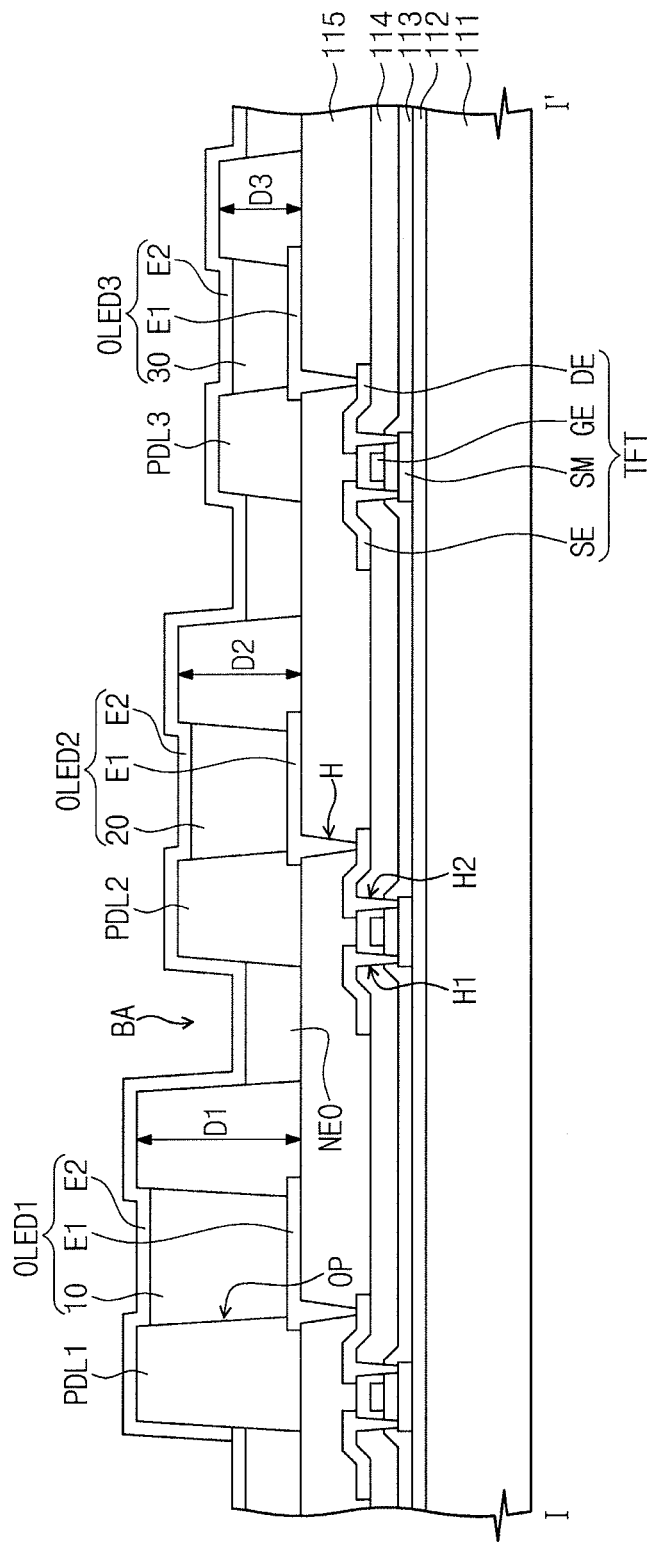

ORGANIC LIGHT EMITTING DISPLAY WITH LUMINESCENT LAYERS HAVING VARYING THICKNESSES TO IMPROVE COLOR REPRODUCIBILITY

CROSS-REFERENCE TO RELATED APPLICATION

This U.S. non-provisional patent application claims priority under 35 U.S.C. §119 of Korean Patent Application No. 10-2012-0117358, filed on Oct. 22, 2012, the contents of which are hereby incorporated by reference.

BACKGROUND

1. Field of Disclosure

The present disclosure generally relates to an organic light emitting display and a method of manufacturing the organic light emitting device.

2. Description of the Related Technology

In recent years, an organic light emitting display has been spotlighted as a next generation display device since it has superior brightness and viewing angle and does not need to include a separate light source when compared to a liquid crystal display. Accordingly, the organic light emitting display has advantages of slimness and lightweight. In addition, the display has properties, e.g., fast response speed, low power consumption, high brightness, etc.

The display generally includes an organic light emitting device including an anode electrode, an organic light emitting layer, and a cathode electrode. Holes and electrons are injected into the organic emitting layer through the anode electrode and the cathode electrode, and are recombined in the organic light emitting layer to generate excitons (electron-hole pairs). The excitons emit energy, which is discharged when an excited state returns to a ground state, as light. The organic light emitting layer is formed in various ways, such as an inkjet printing process, a nozzle printing process, etc.

Red, green, and blue lights emitted from the organic light emitting layer have different wavelengths from each other. To improve color reproducibility, a thickness of the organic light emitting layer is differently set in each organic light emitting device, and thus a resonance distance (or an optical length) between the anode electrode and the cathode electrode is adjusted. In general, the resonance distance of the organic light emitting device that emits the red light is the greatest and the resonance distance of the organic light emitting device that emits the blue light is the smallest. Accordingly, the thickness of the organic light emitting layer of the organic light emitting device that emits the red light is the thickest and the thickness of the organic light emitting layer of the organic light emitting device that emits the blue light is the thinnest.

To form the organic light emitting layer having different thicknesses in each pixel, a concentration of an organic material used to form the organic light emitting layer or a spraying condition in which the organic material is sprayed are controlled. In addition, when the organic material is printed on a substrate many times over, the organic light emitting layer is formed to have different thicknesses.

SUMMARY

One inventive aspect is an organic light emitting display including an organic light emitting device with a high uniformity.

Another aspect is a method of manufacturing the organic light emitting display.

Another aspect is an organic light emitting display that includes a substrate, a plurality of thin film transistors disposed on the substrate, first, second, and third pixel definition layers disposed on the thin film transistors, respectively having openings, and respectively having first, second, and third heights different from each other, and first, second, and third organic light emitting devices disposed in the openings of the first, second, and third pixel definition layers and connected to the thin film transistors, respectively. The first, second, and third pixel definition layers are spaced apart from each other, the first, second, and third organic light emitting devices have different thicknesses from each other, and the first, second, and third organic light emitting devices have thicknesses respectively corresponding to the first, second, and third heights of the first, second, and third pixel definition layers.

The first height of the first pixel definition layer is greater than the second height of the second pixel definition layer, and the second height of the second pixel definition layer is greater than the third height of the third pixel definition layer.

The thickness of the first organic light emitting device is thicker than the thickness of the second organic light emitting device, and the thickness of the second organic light emitting device is thicker than the thickness of the third organic light emitting device.

The organic light emitting display further includes a protective layer disposed to cover the thin film transistors and the first, second, and the third pixel definition layers are disposed on the protective layer. Each of the first, second, and third organic light emitting devices includes first electrodes disposed on the protective layer, respectively connected to the thin film transistors through contact holes formed through the protective layer, and partially exposed through the openings, organic light emitting layers disposed on the first electrodes, and a second electrode disposed on the organic light emitting layers. The second electrode covers the organic light emitting layers and the first, second, and third pixel definition layers, the openings are formed to expose end portions of the first electrodes, and the organic light emitting layers are disposed on the first electrodes in the openings.

The organic light emitting layers include a first organic light emitting layer disposed in the opening formed through the first pixel definition layer, a second organic light emitting layer disposed in the opening formed through the second pixel definition layer, and a third organic light emitting layer disposed in the opening formed through the third pixel definition layer.

The first organic light emitting layer has a thickness thicker than a thickness of the second organic light emitting layer, and the second organic light emitting layer has the thickness thicker than a thickness of the third organic light emitting layer.

The first organic light emitting layer generates a red light, the second organic light emitting layer generates a green light, and a third organic light emitting layer generates a blue light.

Another aspect is a method of manufacturing an organic light emitting display that includes preparing a substrate, forming a plurality of thin film transistors on the substrate, forming first, second, and third pixel definition layers on the thin film transistors such that the first, second, and third pixel definition layers respectively have openings and respectively have first, second, and third heights different from each other, and forming first, second, and third organic light emitting devices in the openings of the first, second, and third pixel definition layers such that the first, second, and third organic light emitting devices have thicknesses respectively corresponding to the first, second, and third heights and are connected to the thin film transistors, respectively. The first, second, and third pixel definition layers are spaced apart from each other.

The first height of the first pixel definition layer is greater than the second height of the second pixel definition layer, and the second height of the second pixel definition layer is greater than the third height of the third pixel definition layer.

The thickness of the first organic light emitting device is thicker than the thickness of the second organic light emitting device, and the thickness of the second organic light emitting device is thicker than the thickness of the third organic light emitting device.

The method further includes forming a protective layer to cover the thin film transistors and connecting the first, second, and third organic light emitting devices to the thin film transistors, respectively, through contact holes formed through the protective layer. The first, second, and third pixel definition layers are disposed on the protective layer.

The forming of the first, second, and third organic light emitting devices includes forming first electrodes on the protective layer to be respectively connected to the thin film transistors through the contact holes and to expose portions of the first electrodes through the openings, providing an organic material on the first electrodes through the openings of the first, second, and third pixel definition layers by the first height of the first pixel definition layer, providing the organic material overflown in the openings of the second and third pixel definition layers to boundary areas between the first, second, and third pixel definition layers, and forming a second electrode to cover organic light emitting layers, which are formed in the openings of the first, second, and third pixel definition layers using the organic material, and the first, second, and third pixel definition layers. The end portions of the first electrodes are exposed through the openings.

The organic light emitting layers include a first organic light emitting layer disposed in the opening formed through the first pixel definition layer, a second organic light emitting layer disposed in the opening formed through the second pixel definition layer, and a third organic light emitting layer disposed in the opening formed through the third pixel definition layer.

The first organic light emitting layer has a thickness thicker than a thickness of the second organic light emitting layer, and the second organic light emitting layer has the thickness thicker than a thickness of the third organic light emitting layer.

The first organic light emitting layer generates a red light, the second organic light emitting layer generates a green light, and a third organic light emitting layer generates a blue light.

The organic material is provided in the openings of the first, second, and third pixel definition layers by an inkjet printing method or a nozzle printing method.

BRIEF DESCRIPTION OF THE DRAWINGS

FIGS. 3A to 3E are cross-sectional view showing a method of manufacturing the organic light emitting display according to an exemplary embodiment of the present disclosure.

DETAILED DESCRIPTION

Figure 1:
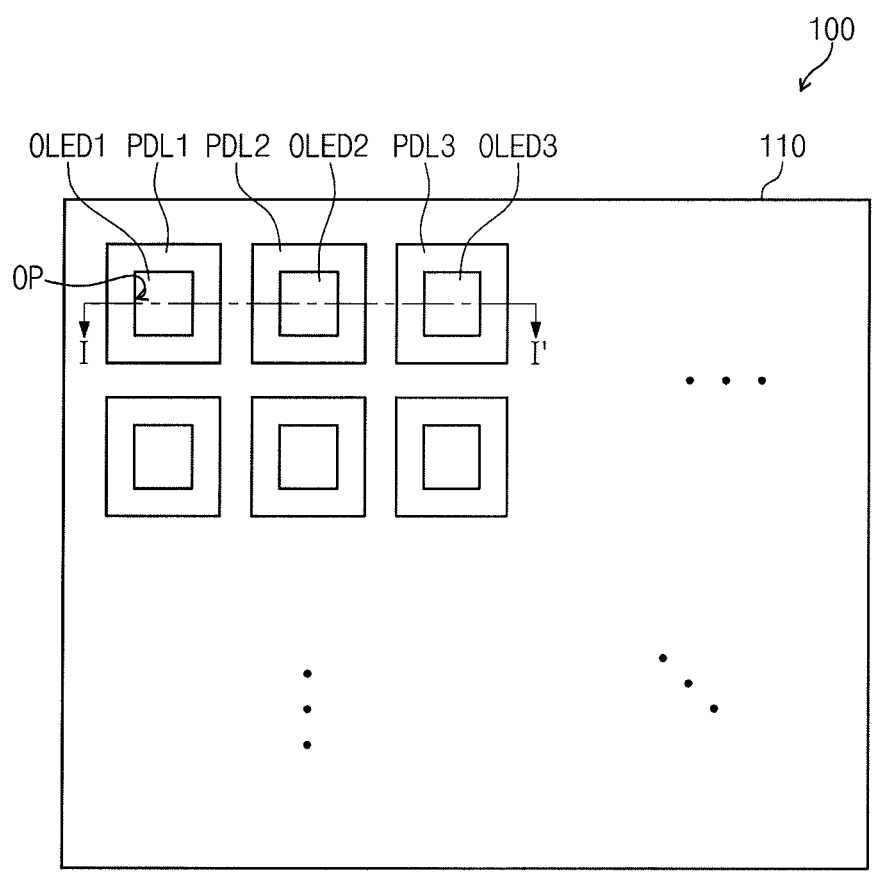
FIG. 1 is a plan view showing an organic light emitting display according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 2:
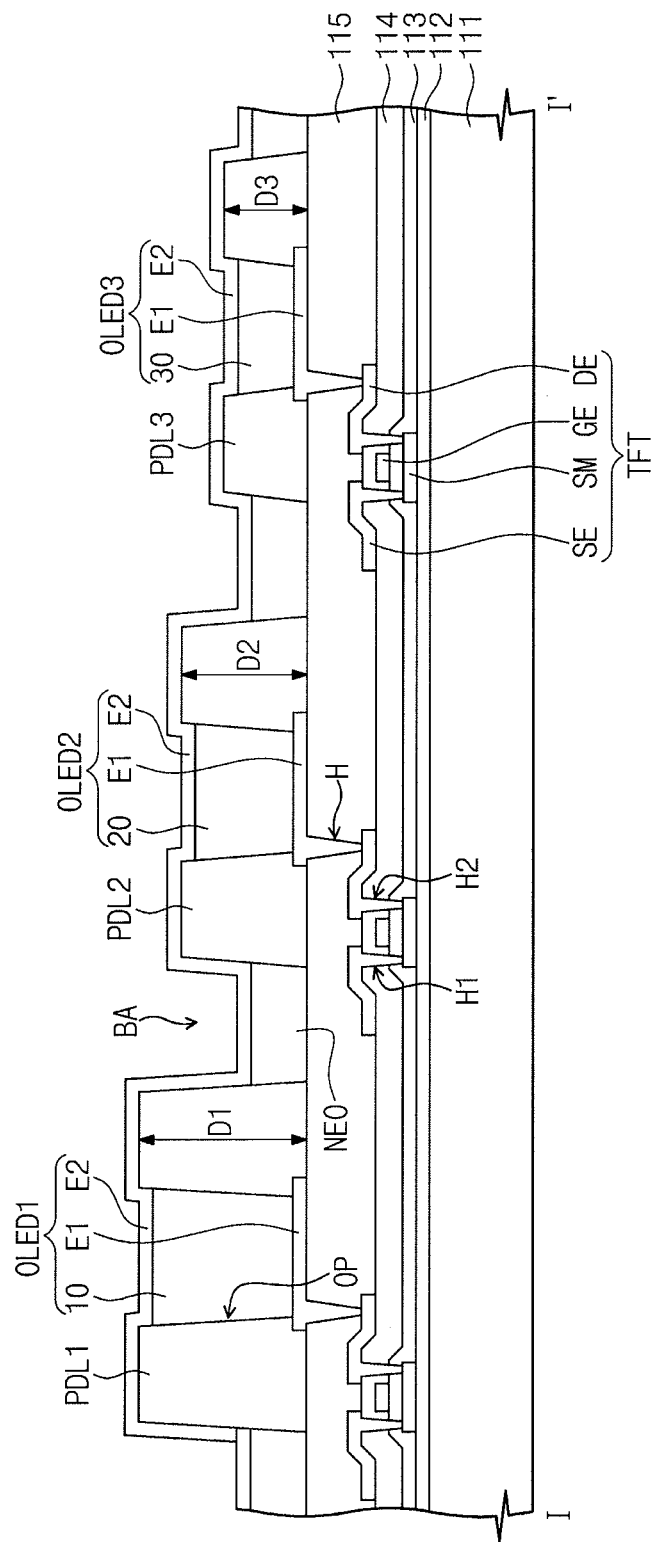
FIG. 2 is a cross-sectional view taken along a line I-I' shown in FIG. 1.

FIG. 1 is a plan view showing an organic light emitting display according to an exemplary embodiment of the present disclosure and FIG. 2 is a cross-sectional view taken along a line I-I' shown in FIG. 1.

Referring to FIGS. 1 and 2, an organic light emitting display 100 includes a display panel 110. The display panel 110 includes a substrate 111, a plurality of thin film transistors TFT disposed on the substrate 111, a plurality of organic light emitting devices OLED1, OLED2, and OLED3 each driven by a corresponding thin film transistor of the thin film transistors, and a plurality of pixel definition layers PDL1, PDL2, and PDL3 each of which defines a corresponding organic light emitting device of the organic light emitting devices OLED1, OLED2, and OLED3.

The pixel definition layers PDL1, PDL2, and PDL3 are disposed to be spaced apart from each other. The pixel definition layers PDL1, PDL2, and PDL3 includes a first pixel definition layer PDL1 defining a first organic light emitting device OLED1, a second pixel definition layer PDL2 defining a second organic light emitting device OLED2, and a third pixel definition layer PDL3 defining a third organic light emitting device OLED3.

The substrate 111 may be a transparent insulating substrate formed of glass, quartz, or ceramic, or a transparent flexible substrate formed of plastic. In addition, the substrate 111 may be a metallic substrate, e.g., stainless steel.

The thin film transistors TFT have the same configuration, and thus hereinafter, one thin film transistor TFT will be described in detail as a representative example.

A buffer layer 112 is disposed on the substrate 111. A semiconductor layer SM of the thin film transistor TFT is disposed on the buffer layer 112. In some embodiments, the semiconductor layer SM is formed of an inorganic semiconductor material or an organic semiconductor material, e.g., amorphous silicon, polysilicon, etc. In addition, the semiconductor layer SM may be formed of an oxide semiconductor material. Although not shown in FIG. 1, the semiconductor layer SM includes a source region, a drain region, and a channel region between the source region and the drain region.

A first insulating layer 113 is disposed to cover the semiconductor layer SM. The first insulating layer 113 may serve as a gate insulating layer. A gate electrode GE of the thin film transistor TFT is disposed on the first insulating layer 113 to at least partially overlap with the semiconductor layer SM. For example, the gate electrode GE at least partially overlaps with the channel region of the semiconductor layer SM. The gate electrode GE is electrically connected to a gate line (not shown) that applies an on/off signal to the thin film transistor TFT.

A second insulating layer 114 is disposed to cover the gate electrode GE. The second insulating layer 114 may serve as an inter-insulating layer. A source electrode SE and a drain electrode DE of the thin film transistor TFT are disposed on the second insulating layer 114 and spaced apart from each other. The source electrode SE is connected to the semiconductor layer SM through a first contact hole H1 formed through the first insulating layer 113 and the second insulating layer 114. For example, the source electrode SE is connected to the source region of the semiconductor layer SM. The drain electrode DE is connected to the semiconductor layer SM through a second contact hole H2 formed through the first insulating layer 113 and the second insulating layer 114. That is, the drain electrode DE is connected to the drain region of the semiconductor layer SM.

A protective layer 115 is disposed to cover the source electrode SE and the drain electrode DE of the thin film transistor TFT. The protective layer 115 planarizes the top surface of the substrate 111 and may be formed of silicon oxide (SiO2), silicon nitride (SiNx). The protective layer 115 may serve as a passivation layer.

First electrodes E1 of the first, second, and third organic light emitting devices OLED1, OLED2, and OLED3 are disposed on the protective layer 115. The first electrodes E1 are respectively connected to the drain electrodes DE of the thin film transistors TFT through contact holes H formed through the protective layer 115. The first electrodes E1 may serve as pixel electrodes or anode electrodes.

The first, second, and third pixel definition layers PDL1, PDL2, and PDL3 are disposed on the protective layer 115. In some embodiments, the first, second, and third pixel definition layers PDL1, PDL2, and PDL3 include openings OP formed therethrough and have different heights D1, D2, and D3. The height is defined by a height between bottom and top surfaces of the first, second, and third pixel definition layers PDL1, PDL2, and PDL3. In some embodiment, a first height D1 of the first pixel definition layer PDL1 is greater than a second height D2 of the second pixel definition layer PDL2, and the second height D2 is greater than a third height D3 of the third pixel definition layer PDL3.

Each of the first, second, and third pixel definition layers PDL1, PDL2, and PDL3 is formed to cover an end portion of a corresponding first electrode of the first electrodes E1. Each of the openings OP of the first, second, and third pixel definition layers PDL1, PDL2, and PDL3 exposes a predetermined portion of the corresponding first electrode of the first electrodes E1. The first, second, and third pixel definition layers PDL1, PDL2, and PDL3 may be formed of an organic insulating material. Each of the first, second, and third pixel definition layers PDL1, PDL2, and PDL3 may also be formed by sequentially stacking an inorganic insulating layer and an organic insulating layer.

Organic light emitting layers 10, 20, and 30 are respectively disposed on the first electrodes E1 exposed through the openings OP of the first, second, and third pixel definition layers PDL1, PDL2, and PDL3. The organic light emitting layers 10, 20, 30 include a first organic light emitting layer 10 formed in the opening OP of the first pixel definition layer PDL1, a second organic light emitting layer 20 formed in the opening OP of the second pixel definition layer PDL2, and a third organic light emitting layer 30 formed in the opening OP of the third pixel definition layer PDL3.

The first, second, and third organic light emitting layers 10, 20, and 30 include organic materials that generate lights, e.g., red, green, and blue lights, and the organic light emitting display 100 displays a white color by combining the red, green, and blue lights. For instance, the first organic light emitting layer 10 generates the red light, the second organic light emitting layer 20 generates the green light, and the third light emitting layer 30 generates the blue light.

Areas between the first, second, and third pixel definition layers PDL1, PDL2, and PDL3 are defined as boundary areas BA. The organic material used to form the first, second, and third organic light emitting layers 10, 20, 30 is provided in the openings OP of the first, second, and third pixel definition layers PDL1, PDL2, and PDL3 by the first height D1 of the first pixel definition layer PDL1. Since the organic material is provided by the first height D1 of the first pixel definition layer PDL1, the organic material may be overflown beyond upper edges of the second and third pixel definition layers PDL2 and PDL3. The organic material overflown beyond the second and third pixel definition layers PDL2 and PDL3 is provided to the boundary area BA. Thus, the organic material provided to the openings OP of the second and third pixel definition layers PDL2 and PDL3 are filled in the openings OP of the second and third pixel definition layers PDL2 and PDL3 by the second and third heights D2 and D3. The method of filling the openings OP of the first, second, and third pixel definition layers PDL1, PDL2, and PDL3 will be described in detail below.

The organic material is dried to form the first, second, and third organic light emitting layers 10, 20, and 30. Since the volume of the organic material is reduced while being dried, the organic light emitting layers 10, 20, and 30 have been shown to have heights smaller than the first, second, and third heights D1, D2, and D3, respectively, as shown in FIG. 2. The first organic light emitting layer 10 has a thickness thicker than the thickness of the second organic light emitting layer 20, and the thickness of the second organic light emitting layer 20 is thicker than the thickness of the third organic light emitting layer 30. That is, the thicknesses of the first, second, and third organic light emitting layers 10, 20, and 30 may be easily controlled using the first, second, and third pixel definition layers PDL1, PDL2, and PDL3 having the first, second, and third heights D1, D2, and D3 different from each other.

When the organic material provided to the boundary area BA is dried, an organic layer is formed. The organic layer formed in the boundary area BA serves as non-light emitting organic layers NEO.

The organic material may remain on the upper surface of the first, second, and third pixel definition layers PDL1, PDL2, and PDL3, but this is a very small amount as compared to that of the organic material provided to the boundary area BA and the volume of the organic material remaining the upper surface of the first, second, and third pixel definition layers PDL1, PDL2, and PDL3 is more reduced while being dried. Therefore, for the convenience of explanation, the organic material remaining on the upper surface of the first, second, and third pixel definition layers PDL1, PDL2, and PDL3 has been omitted in FIG. 2.

A second electrode E2 is disposed on the organic light emitting layers 10, 20, and 30. For example, the second electrode E2 is disposed on the first, second, and third pixel definition layers PDL1, PDL2, and PDL3 and the first, second, and third organic light emitting layers 10, 20, and 30. The second electrode E2 may serve as a common electrode or a cathode electrode.

The first electrode E1 is a transparent electrode or a reflective electrode. When the first electrode E1 is the transparent electrode, the first electrode E1 includes indium tin oxide (ITO), indium zinc oxide (IZO), or zinc oxide (ZnO). When the first electrode E1 is the reflective electrode, the first electrode E1 includes a reflective layer formed of Ag, Mg, Al, Pt, Pd, Au, Ni, Nd, Ir, Cr, or compound thereof and a transparent conductive layer formed of ITO, IZO, or ZnO.

The second electrode E2 is a transparent electrode or a reflective electrode. When the second electrode E2 is the transparent electrode, the second electrode E2 includes a layer formed by depositing, for example, Li, Ca, LiF/Ca, LiF/Al, Al, Mg, or compound thereof and facing the organic light emitting layer and an auxiliary electrode formed on the layer using a transparent conductive material, e.g., ITO, IZO, ZnO, etc. When the second electrode E2 is the reflective electrode, the second electrode E2 may be formed of Ag, Mg, Al, Pt, Pd, Au, Ni, Nd, Ir, Cr, Li, Ca, LiF/Ca, LiF/Al, or compound thereof.

In some embodiments, the first, second, and third organic light emitting layers 10, 20, and 30 are formed of a low-molecular organic material or a high-molecular organic material. Although not shown in figures, each of the organic light emitting layers 10, 20, and 30 has a multi-layer structure of a hole injection layer (HIL), a hole transport layer (HTL), an emission layer (EML), an electron transport layer (ETL), and an electron injection layer (EIL). As an example, the hole injection layer is disposed on the first electrode E1 that is positive, and the hole transport layer, the emission layer, the electron transport layer, and the electron injection layer are sequentially stacked on the hole injection layer.

The first electrodes E1 may have a positive polarity as the hole injection layer and the second electrode E2 may have a negative polarity as the electron injection layer. Alternatively, the first electrodes E1 have the negative polarity and the second electrode E2 has the positive polarity according to the driving method of the organic light emitting display 100.

The first, second, and third organic light emitting devices OLED1, OLED2, and OLED3 include the first electrodes E1, the first, second, and third organic light emitting layers 10, 20, and 30, and the second electrode E2. For example, the first organic light emitting device OLED1 includes the corresponding first electrode E1, the first organic light emitting layer 10, and the second electrode E2. The second organic light emitting device OLED2 includes the corresponding first electrode E1, the second organic light emitting layer 20, and the second electrode E2. The third organic light emitting device OLED3 includes the corresponding first electrode E1, the third organic light emitting layer 30, and the second electrode E2.

Since the first, second, and third organic light emitting layers 10, 20, and 30 have different thicknesses, the first, second, and third organic light emitting devices OLED1, OLED2, and OLED3 have different thickness. For example, the organic light emitting devices OLED1, OLED2, and OLED3 have the thicknesses corresponding to the heights D1, D2, and D3 of the pixel definition layers PDL1, PDL2, and PDL3, respectively. Accordingly, the thickness of the first organic light emitting device OLED1 is thicker than the thickness of the second organic light emitting device OLED2, and the thickness of the second organic light emitting device OLED2 is thicker than the thickness of the third organic light emitting device OLED3.

The thicknesses of the organic light emitting layers 10, 20, 30 may be defined by optical lengths, i.e., the distances between the first electrodes E1 and the second electrode E2. The optical lengths of the organic light emitting layers OLED1, OLED2, and OLED3 may be set to correspond to the wavelengths of the organic light emitting layers 10, 20, and 30. Thus, color purity and light efficiency of the emitted light are increased, so that the color reproducibility of the organic light emitting display 100 may be improved.

Due to the thin film transistor TFT, a driving source voltage is applied to the first electrodes E1 and a source voltage having an opposite polarity to that of the driving source voltage is applied to the second electrode E2 so as to allow the organic light emitting layers 10, 20, and 30 of the organic light emitting device OLED1, OLED2, and OLED3 to emit the light. In this case, holes and electrons, which are injected into the first, second, and third organic emitting layers 10, 20, and 30, are recombined to generate excitons (electron-hole pairs), and the organic light emitting devices OLED1, OLED2, and OLED3 emit the light when an excited state of the excitons returns to a ground state. Accordingly, the organic light emitting devices OLED1, OLED2, and OLED3 emit the red, green, and blue lights in accordance with the flow of current, thereby displaying predetermined image information. Since the first electrodes E1 are not formed in the boundary area BA, the non-light emitting organic layers NEO disposed in the boundary area BA does not emit the light.

Since the organic light emitting display 100 may set the thicknesses of the first, second, and third organic light emitting layers 10, 20, and 30 by using the first, second, and third pixel definition layers PDL1, PDL2, and PDL3, the organic light emitting display 100 may improve the color reproducibility.

FIGS. 3A to 3E are cross-sectional view showing a method of manufacturing the organic light emitting display according to an exemplary embodiment of the present disclosure.

Figure 3A:
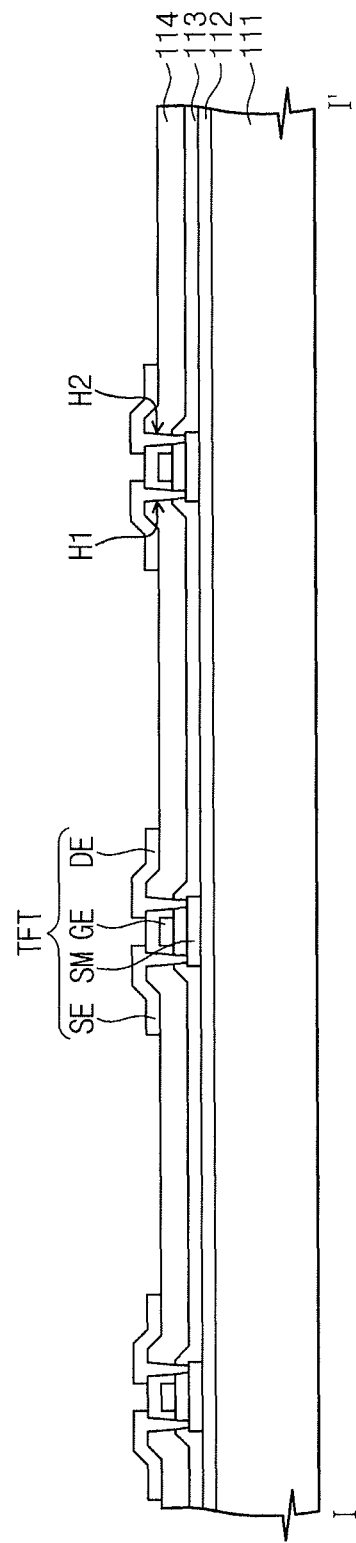

Referring to FIG. 3A, the substrate 111 is prepared and the thin film transistors TFT are formed on the substrate 111. For example, the buffer layer 112 is formed on the substrate 111 and the thin film transistors TFT are formed on the buffer layer 112. The configuration of the thin film transistor is the same as in the description provided above.

Figure 3B:
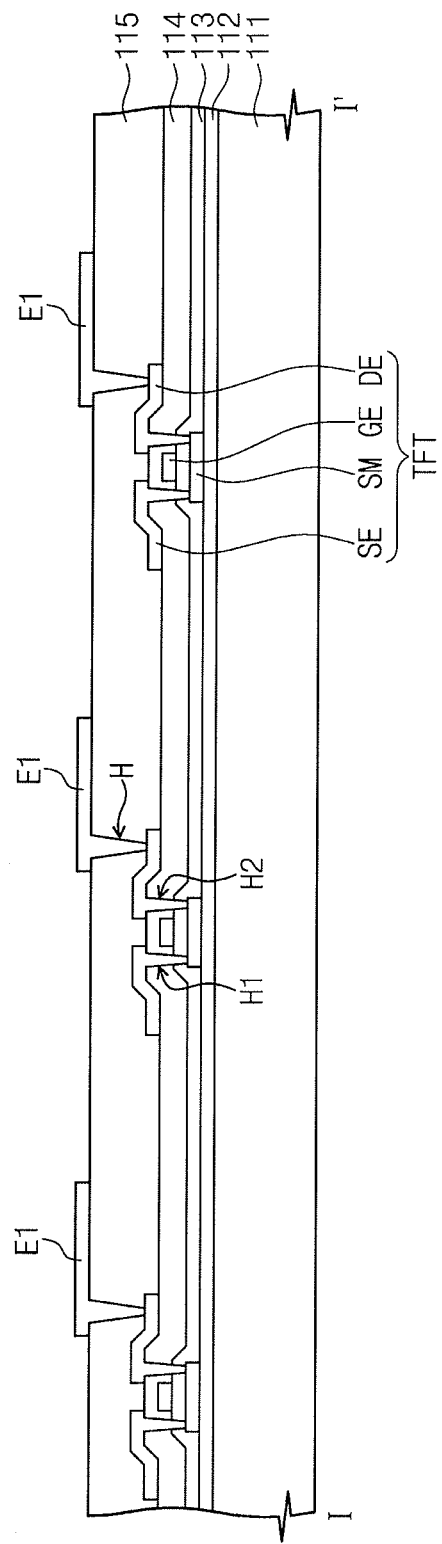

Referring to FIG. 3B, the protective layer 115 is formed on the substrate 111 to cover the thin film transistors TFT. The protective layer 115 is provided with the contact holes H formed therethrough to expose the drain electrodes of the thin film transistors TFT. The first electrodes E1 are formed on the protective layer 115. The first electrodes E1 are connected to the thin film transistors, respectively, through the contact holes H. For example, the first electrodes E1 are respectively connected to the drain electrodes DE of the thin film transistors TFT.

Figure 3C:
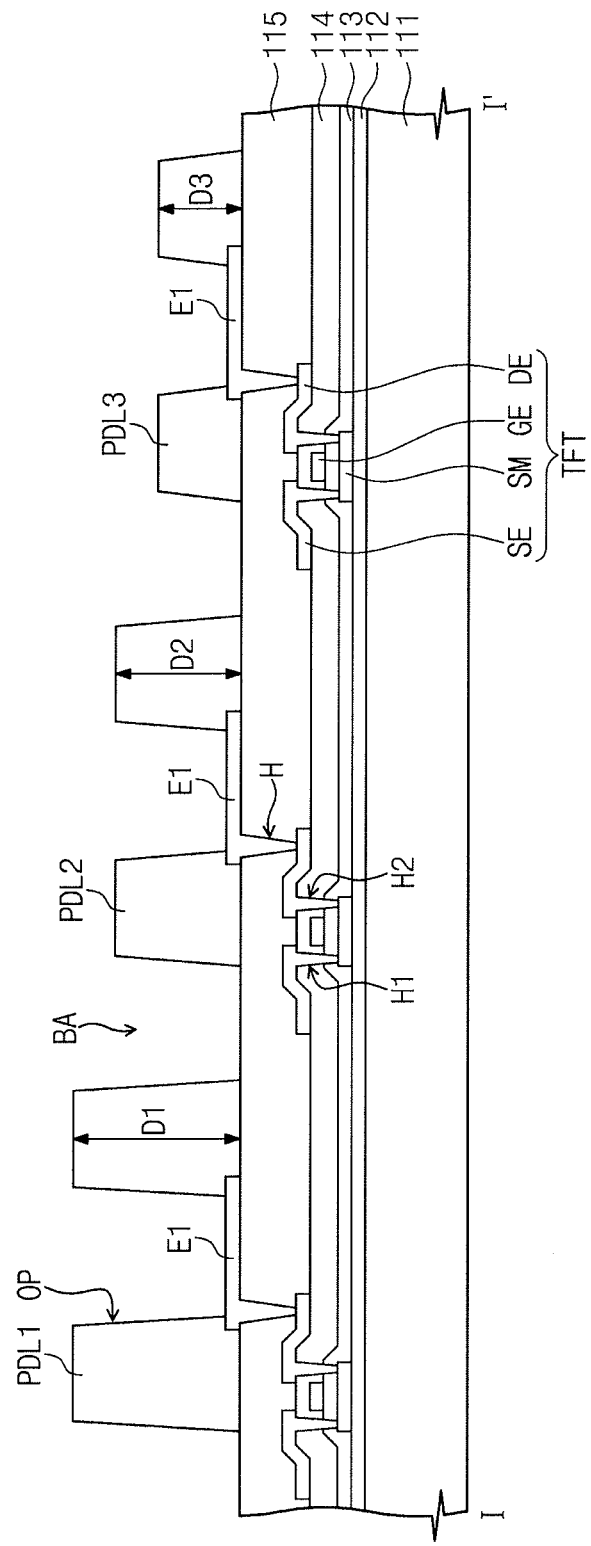

Referring to FIG. 3C, the first, second, and third pixel definition layers PDL1, PDL2, and PDL3 are formed on the protective layer 115. The pixel definition layers PDLL, PDL2, and PDL3 have the first, second, and third heights D1, D2, and D3 different from each other and the openings OP formed therethrough. The first, second, and third pixel definition layers PDL1, PDL2, and PDL3 are spaced apart from each other. The first pixel definition layer PDL1 has the first height D1, the second pixel definition layer PDL2 has the second height D2 smaller than the first height D2, and the third pixel definition layer PDL3 has the third height D3 smaller than the second height D2.

The first, second, and third pixel definition layers PDL1, PDL2, and PDL3 are formed to cover the end portions of the first electrodes E1. The openings OP of the first, second, and third pixel definition layers PDL1, PDL2, and PDL3 expose the portions of the first electrodes E1, respectively.

Figure 3D:
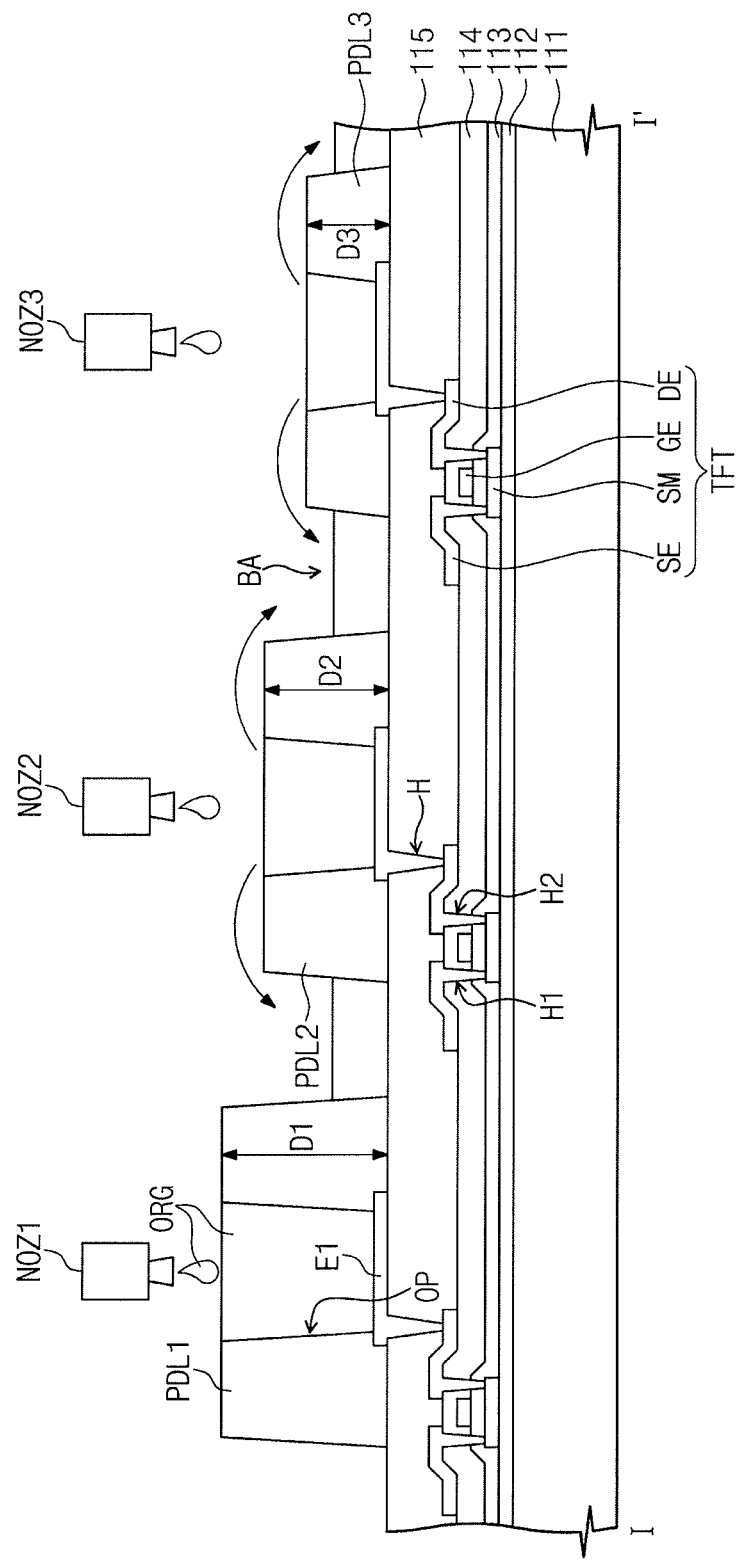

Referring to FIG. 3D, the organic material ORG is provided in the openings OP of the first, second, and third pixel definition layers PDL1, PDL2, and PDL3 using first, second, and third nozzles NOZ1, NOZ2, and NOZ3.

The organic material ORG is provided in the openings OP of the pixel definition layers PDL1, PDL2, and PDL3 by the first height D1 of the first pixel definition layer PDL1. Since the organic material ORG is provided by the first height D1 of the first pixel definition layer PDL1, the organic material ORG may be overflown in the openings OP of the second and third pixel definition layers PDL2 and PDL3. The organic material ORG overflown in the openings OP of the second and third pixel definition layers PDL2 and PDL3 is provided to the boundary areas BA. Accordingly, the organic material ORG, which is provided to the openings OP of the second and third pixel definition layers PDL2 and PDL3, is filled in the openings OP of the second and third pixel definition layers PDL2 and PDL3 by the second and third heights D2 and D3 of the second and third pixel definition layers PDL2 and PDL3.

The organic material ORG is filled in the openings OP of the first, second, and third pixel definition layers PDL1, PDL2, and PDL3 using the inkjet printing process or the nozzle printing process. FIG. 3D shows the inkjet printing process as an example.

Referring to FIG. 3E, the organic material ORG provided in the openings OP of the first, second, and third pixel definition layers PDL1, PDL2, and PDL3 is dried so as to form the first, second, and third organic light emitting layers 10, 20, and 30. In addition, the organic material ORG provided in the boundary area BA is dried to form the non-light emitting layers NEO, Since the volume of the organic material ORG is reduced while the organic material ORG is dried, the first, second, and third organic light emitting layers 10, 20, and 30 have the heights smaller than the first, second, and third heights D1, D2, and D3 of the first, second, and third pixel definition layers PDL1, PDL2, and PDL3, respectively. The thickness of the first organic light emitting layer 10 is thicker than the thickness of the second organic light emitting layer 20, and the thickness of the second organic light emitting layer 20 is thicker than the thickness of the third organic light emitting layer 30. Accordingly, the thicknesses of the organic light emitting layers 10, 20, and 30 may be easily controlled by using the corresponding pixel definition layers PDL1, PDL2, and PDL3 having the first, second, and third heights D1, D2, and D3 different from each other.

As described above, the organic material remains on the upper surface of the first, second, and third pixel definition layers PDL1, PDL2, and PDL3.

The second electrode E2 is formed to cover the first, second, and third pixel definition layers PDL1, PDL2, and PDL3 and the first, second, and third organic light emitting layers 10, 20, and 30.

When a pixel definition layer is formed in a lattice shape layer on a protective layer and has a uniform height, a concentration of an organic material used to form the organic light emitting layer or a spraying condition in which the organic material is sprayed are controlled in order to form the organic light emitting layer having different thicknesses in each pixel. In addition, when the organic material is printed on a substrate many times over, the organic light emitting layer is formed to have different thicknesses. In those cases, however, differences in dry time and in print time of the organic material occur. As a result, the uniformity of the organic light emitting layer is degraded due to the difference in dry time between the firstly printed organic material and the lately printed organic material. In addition, since the concentration and the spraying condition of the organic material are required to be controlled, the process of forming the pixel definition layer is complicated. Accordingly, the process time and the manufacturing cost are remarkably increased.

In the present embodiment, however, the organic material ORG is provided once in the manufacturing process of the pixel definition layers PDL1, PDL2, and PDL3, and the organic light emitting layers 10, 20, and 30 are formed to have the different thicknesses by using the heights D1, D2, and D3 of the pixel definition layers PDL1, PDL2, and PDL3. Thus, the spraying condition of the organic material ORG is simplified and the organic material ORG is sufficient to be provided once to the openings OP in the manufacturing process of the pixel definition layers PDL1, PDL2, and PDL3.

According to at least one of the disclosed embodiments, the concentration and the spraying condition of the organic material may be simplified. Thus, the differences in the dry time and in the print time may be prevented from occurring. Therefore, the uniformity of a plurality of organic light emitting devices may be improved, and the manufacturing process of the organic light emitting devices may be simplified.

Although certain embodiments have been described, it is understood that the present invention should not be limited to disclosed embodiments but various changes and modifications can be made by one ordinary skilled in the art within the spirit and scope of the present invention as hereinafter claimed.

What is claimed is:
1. An organic light emitting display comprising:
a substrate;
first, second and third thin film transistors disposed on the substrate;
first, second, and third pixel definition layers respectively disposed on the thin film transistors and respectively having first, second, and third heights different from each other, wherein an opening is formed in each of the pixel definition layers; and first, second, and third organic light emitting devices respectively disposed in the openings of the pixel definition layers and electrically connected to the thin film transistors, respectively, wherein the pixel definition layers are spaced apart from each other, wherein the organic light emitting devices have thicknesses which are different from each other and respectively correspond to the first, second, and third heights of the pixel definition layers.

2. The organic light emitting display of claim 1, wherein the first height of the first pixel definition layer is greater than the second height of the second pixel definition layer, and wherein the second height of the second pixel definition layer is greater than the third height of the third pixel definition layer.

3. The organic light emitting display of claim 2, wherein the thickness of the first organic light emitting device is greater than the thickness of the second organic light emitting device, and wherein the thickness of the second organic light emitting device is greater than the thickness of the third organic light emitting device.

4. The organic light emitting display of claim 1, further comprising a protective layer disposed to cover the thin film transistors, wherein the pixel definition layers are disposed on the protective layer, wherein each of the organic light emitting devices comprises:

a plurality of first electrodes disposed on the protective layer and respectively connected to the thin film transistors through contact holes formed through the protective layer;

a plurality of organic light emitting layers respectively disposed on the first electrodes; and a second electrode disposed on the organic light emitting layers, wherein the second electrode covers the organic light emitting layers and the pixel definition layers, wherein the first, second, and third pixel definition layers cover end portions of the first electrodes, and wherein the organic light emitting layers are disposed on the first electrodes in the openings.

5. The organic light emitting display of claim 4, wherein the organic light emitting layers comprise:

a first organic light emitting layer disposed in the opening formed through the first pixel definition layer;

a second organic light emitting layer disposed in the opening formed through the second pixel definition layer; and a third organic light emitting layer disposed in the opening formed through the third pixel definition layer.

6. The organic light emitting display of claim 5, wherein the first organic light emitting layer has a thickness greater than the thickness of the second organic light emitting layer, and wherein the thickness of the second organic light emitting layer is greater than the thickness of the third organic light emitting layer.

7. The organic light emitting display of claim 6, wherein the first organic light emitting layer is configured to generate a red light, wherein the second organic light emitting layer is configured to generate a green light and wherein a third organic light emitting layer is configured to generate a blue light.

* * * * *